United States Patent
Uprety et al.

(10) Patent No.: US 9,309,589 B2
(45) Date of Patent: Apr. 12, 2016

(54) OUTBOARD DURABLE TRANSPARENT CONDUCTIVE COATING ON AIRCRAFT CANOPY

(75) Inventors: Krishna Uprety, Valencia, CA (US); Alexander Bimanand, Burbank, CA (US); Khushroo H. Lakdawala, Santa Clarita, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 412 days.

(21) Appl. No.: 13/165,680

(22) Filed: Jun. 21, 2011

(65) Prior Publication Data

US 2012/0328859 A1 Dec. 27, 2012

(51) Int. Cl.
| | |
|---|---|
| *B32B 15/04* | (2006.01) |
| *H01B 1/00* | (2006.01) |
| *C23C 14/08* | (2006.01) |
| *B64C 1/14* | (2006.01) |
| *C23C 14/20* | (2006.01) |
| *H01B 1/08* | (2006.01) |

(52) U.S. Cl.
CPC ............. *C23C 14/086* (2013.01); *B64C 1/1476* (2013.01); *C23C 14/205* (2013.01); *H01B 1/08* (2013.01); *Y10T 428/24975* (2015.01); *Y10T 428/265* (2015.01); *Y10T 428/31515* (2015.04); *Y10T 428/31609* (2015.04); *Y10T 428/31663* (2015.04)

(58) Field of Classification Search
CPC ................... Y10T 428/24975; Y10T 428/265; C23C 14/08–14/081; B64C 1/14; B64C 1/1476–1/1492
See application file for complete search history.

(56) References Cited

U.S. PATENT DOCUMENTS

| | | |
|---|---|---|
| 3,017,386 A | 1/1962 | Brown, Jr. et al. |
| 3,180,781 A | 4/1965 | Ryan et al. |
| 4,234,664 A | 11/1980 | Hendy |
| 4,336,119 A | 6/1982 | Gillery |
| 4,465,736 A | 8/1984 | Nishihara et al. |
| 4,642,263 A | 2/1987 | Culbertson |
| 5,084,132 A | 1/1992 | Smith |
| 5,213,828 A | 5/1993 | Winter et al. |

(Continued)

FOREIGN PATENT DOCUMENTS

| | | |
|---|---|---|
| EP | 1 253 166 A2 | 10/2002 |
| EP | 1 253 166 A3 | 1/2004 |

(Continued)

OTHER PUBLICATIONS

Barbato et al. "Definition of Terms Relating to Aircraft Windscreens, Canopies, and Transparencies". Armstrong Laboratory, Wright-Patterson AFB, (1993); pp. 1-40.*

(Continued)

*Primary Examiner* — Prashant J Khatri
(74) *Attorney, Agent, or Firm* — Lewis Roca Rothgerber Christie LLP (57) ABSTRACT

A coated transparency including an electrically conductive multilayer stack is disclosed. The electrically conductive multilayer stack includes a first metal oxide layer including aluminum doped zinc (AZO), a metal layer including gold, and a second metal oxide layer including AZO. The electrically conductive multilayer stack has a low sheet resistance to provide radar attenuation and anti-static or static-dissipative properties, and has greater flexibility and resistance to corrosion than conventional multilayer stacks used to coat aircraft canopies and other substrates.

18 Claims, 7 Drawing Sheets

(56) References Cited

U.S. PATENT DOCUMENTS

| | | | |
|---|---|---|---|
| 5,378,535 A | 1/1995 | Moncur et al. | |
| 5,780,160 A | 7/1998 | Allemand et al. | |
| 5,859,722 A | 1/1999 | Suga et al. | |
| 5,939,188 A * | 8/1999 | Moncur | C03C 17/42 428/332 |
| 6,213,602 B1 | 4/2001 | Smarto | |
| 6,417,292 B1 | 7/2002 | Moriarity et al. | |
| 6,426,125 B1 | 7/2002 | Yang et al. | |
| 6,690,564 B1 | 2/2004 | Haruta et al. | |
| 6,737,121 B2 | 5/2004 | Yang et al. | |
| 6,933,053 B2 | 8/2005 | Alger | |
| 7,005,794 B2 * | 2/2006 | Watanabe et al. | 313/489 |
| 7,093,307 B1 | 8/2006 | Smith | |
| 7,626,749 B2 | 12/2009 | Baur et al. | |
| 7,636,188 B2 | 12/2009 | Baur et al. | |
| 7,859,738 B2 | 12/2010 | Baur et al. | |
| 2002/0110695 A1 | 8/2002 | Yang et al. | |
| 2003/0054172 A1 | 3/2003 | Savu et al. | |
| 2004/0233499 A1 * | 11/2004 | Betelle | B32B 17/10036 359/265 |
| 2005/0164010 A1 * | 7/2005 | Trombetta | 428/423.4 |
| 2006/0134501 A1 | 6/2006 | Lee et al. | |
| 2007/0002421 A1 | 1/2007 | Rukavina et al. | |
| 2007/0029299 A1 | 2/2007 | Prone et al. | |
| 2007/0224340 A1 | 9/2007 | Hatta et al. | |
| 2007/0249088 A1 | 10/2007 | Ohmori et al. | |
| 2008/0073622 A1 | 3/2008 | Housel | |
| 2008/0118762 A1 * | 5/2008 | Morimoto et al. | 428/457 |
| 2008/0174872 A1 * | 7/2008 | Morimoto et al. | 359/585 |
| 2008/0176973 A1 | 7/2008 | Qiu et al. | |
| 2008/0212189 A1 | 9/2008 | Baur et al. | |
| 2009/0040306 A1 | 2/2009 | Foote et al. | |
| 2009/0074973 A1 | 3/2009 | Graham et al. | |
| 2009/0080055 A1 | 3/2009 | Baur et al. | |
| 2009/0289235 A1 | 11/2009 | Kniajanski et al. | |
| 2009/0301461 A1 | 12/2009 | Taplan et al. | |
| 2010/0025533 A1 * | 2/2010 | Bimanand et al. | 244/121 |
| 2010/0028684 A1 | 2/2010 | Mariscal et al. | |
| 2010/0066519 A1 | 3/2010 | Baur et al. | |
| 2010/0156842 A1 | 6/2010 | Cherif | |
| 2011/0216389 A1 * | 9/2011 | Piroux | G02F 1/15 359/268 |

FOREIGN PATENT DOCUMENTS

| | | |
|---|---|---|
| EP | 2128528 A2 | 12/2009 |
| WO | WO 00/55389 | 9/2000 |
| WO | WO 2004/106582 A2 | 12/2004 |
| WO | WO 2006/124682 A2 | 11/2006 |
| WO | WO 2007/083969 A1 | 7/2007 |
| WO | WO2010063729 A1 * | 6/2010 |

OTHER PUBLICATIONS

Berredjem, Y., et al., "On the improvement of the efficiency of organic photovoltaic cells by the presence of an ultra-thin metal layer at the interface organic/ITO," Oct. 24, 2008, p. 223-228, 44, The European Physical Journal Applied Physics.

Cairns, Darran R., et al., "Strain-dependent electrical resistance of tin-doped indium oxide on polymer substrates," Mar. 13, 2000, p. 1425-1427, vol. 76, No. 11, Applied Physics Letters.

Fortunato, Elvira, et al., "Influence of the Strain on the Electrical Resistance of Zinc Oxide Doped Thin Film Deposited on Plymer Substrates," May 1, 2002, p. 610-612, vol. 4, No. 8, Advanced Engineering Materials.

Zhao, Bao-xing, et al., "Microstructure and optical properties of $TiO_2$ thin films deposited at different oxygen flow rates", Transactions of Nonferrous Metals Society of China, 20, Dec. 14, 2009, pp. 1429-1433.

U.S. Office action dated Jul. 1, 2013, for cross reference U.S. Appl. No. 13/631,773, 16 pages.

International Search Report and Written Opinion for PCT/US2013/053823, mailed on Nov. 27, 2013, 10 pages.

International Search Report and Written Opinion for International Patent Application No. PCT/US09/52009 dated Sep. 15, 2009, 11 pages.

International Search Report and Written Opinion for International Patent Application No. PCT/US2009/052015 dated Sep. 23, 2009, 11 pages.

European Search Report for EP Application No. 09803512.4 dated Feb. 3, 2014, 8 pages.

Lansåker, P.C., et al. "$TiO_2$/Au/$TiO_2$ multilayer thin films; Novel metal-based transparent conductors for electrochromic devices," Thin Solid Films, vol. 518, 2009, pp. 1225-1229.

* cited by examiner

OUTBOARD DURABLE TRANSPARENT CONDUCTIVE COATING ON AIRCRAFT CANOPY

FIELD OF THE INVENTION

The following description relates generally to coated transparencies (e.g., coated laminates). More specifically, the following description relates to a coated transparency including an electrically conductive multilayer stack having low sheet resistance to provide radar attenuation and anti-static or static-dissipative properties.

BACKGROUND OF THE INVENTION

Aircraft canopies, and particularly stealth aircraft canopies, preferably include a low resistance (i.e., high electrical conductivity) layer (or layers) to prevent or reduce the buildup of static charge and to provide radar attenuation. Static charge can buildup on a canopy as the result of precipitation static and/or lightning strikes, and may interfere with various functions of the aircraft. By including a low resistance layer (or layers), an aircraft canopy can drain or dissipate static electricity and thereby prevent or reduce the buildup of static charge on the canopy. The low resistance layer (or layers) may be coated with a high resistance topcoat (e.g., a polyurethane antistatic coating), so long as the static charge can be transferred through the organic topcoat into the low resistance layer (or layers).

Modern jet aircraft canopies, such as F-22 stealth fighter canopies, are typically made of polymeric materials. Such materials are preferred because of their light weight, high strength, and ease of shaping. Most polymeric materials, however, do not meet the requirements for stealth aircraft, such as low sheet resistance and the ability to withstand extreme weather conditions. As a result, coatings (e.g., organic and inorganic coatings) are employed to impart high electrical conductivity and other necessary characteristics to the canopy.

Typically these coatings include a metal layer, e.g., a silver (Ag), platinum (Pt), palladium (Pd), or tungsten (W) layer, and anti-reflective metal oxide layers, e.g., indium tin oxide (ITO) or titanium dioxide ($TiO_2$) layers, to impart electrical conductivity and transparency to the coating. Metal layers including silver have been preferred, as such layers exhibit high electrical conductivity and neutral color. However, silver lacks corrosion resistance, and the oxidation of silver to silver oxide reduces the flexibility and light transmission of the metal layer. Because silver is more susceptible to corrosion at higher temperatures, anti-reflective metal oxide coatings typically have been applied to the silver layer at reduced temperatures, which reduces the tensile elongation property of the resulting anti-reflective metallic oxide coating. Additionally, because environmental exposure (e.g., moisture, ultraviolet light, and/or acid rain) may result in the oxidation of silver, coatings including a silver layer often also include one or more organic layers, such as hydrophobic polymers, to protect the silver from environmental exposure. Although the organic layers may reduce the exposure of the silver to moisture, such coatings have exhibited limited service life due to the rapid degradation of the electrical and optical properties of the coating. Additionally, the metal oxide layers, for example the ITO layers, are typically limited to ultra thin layers, which limits the light transmittance of the coating.

Accordingly, a need still remains for electrically conductive coatings having greater durability and functionality.

SUMMARY

Aspects of embodiments of the present invention are directed to a coated transparency including a transparency and an electrically conductive multilayer stack including a first metal oxide layer including aluminum doped zinc (AZO), a metal layer including gold (Au), and a second metal oxide layer including AZO, wherein the first metal oxide layer is positioned over the transparency, the metal layer is positioned over the first metal oxide layer, and the second metal oxide layer is positioned over the metal layer.

In certain embodiments of the present invention, the coated transparency is an aircraft canopy.

The first metal oxide layer may have a thickness in a range of about 10 to about 200 nm.

According to certain embodiments, the first metal oxide layer has a thickness in a range of greater than 20 to about 200 nm.

The metal layer may have a thickness in a range of about 5 to about 20 nm.

The second metal oxide layer may have a thickness in a range of about 10 to about 200 nm.

According to certain embodiments, the second metal oxide layer has a thickness in a range of greater than 20 to about 200 nm Aspects of embodiments of the present invention are also directed to an electrically conductive multilayer stack that is transparent.

The electrically conductive multilayer stack may have a light transmittance of at least about 65%.

According to certain embodiments of the invention, the coated transparency also includes a base layer positioned over the transparency, wherein the base layer is between the transparency and the electrically conductive multilayer stack.

The base layer may include a material selected from the group consisting of polyepoxides, polyacrylates, polyurethanes, polysiloxanes, and combinations thereof.

The coated transparency may also include a tie layer positioned over the transparency, wherein the tie layer is between the transparency and the base layer.

Aspects of embodiments of the present invention are also directed to a coated transparency that further includes a topcoat positioned over the electrically conductive multilayer stack.

The topcoat may include polyurethane.

The topcoat may be in direct physical contact with the second metal oxide layer.

In certain embodiments, the coated transparency further includes a topcoat tie layer between the topcoat and the electrically conductive multilayer stack.

The topcoat tie layer may be electrically conductive.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following description and in the claims, various layers are described as being "positioned over," "disposed over," "located on," or "on" one or more additional layers. This language simply denotes the relative positions of the layers. Thus, in some embodiments, two layers are literally right next to each other, while in other embodiments, the same two layers are separated by one or more additional layer(s). In each case, one of the two layers is considered to be "positioned over," "disposed over," "located on," or "on" the other layer. Also, "over" or "on" can mean "below." For example, a layer that is "over" or "on" another layer can also be considered "below" the other layer, depending upon the point of view.

As used herein, the term "coated substrate" or "coated transparency" refers to a substrate or transparency that has been protected (e.g., coated) with one or more layer(s) of metal and/or metal oxide to provide a conductive layer on the substrate. The substrate or transparency can be made of glass or plastic, coated or uncoated, and may form a window or a windshield of a car, aircraft, or boat, a building, or another structure.

Figure 1:
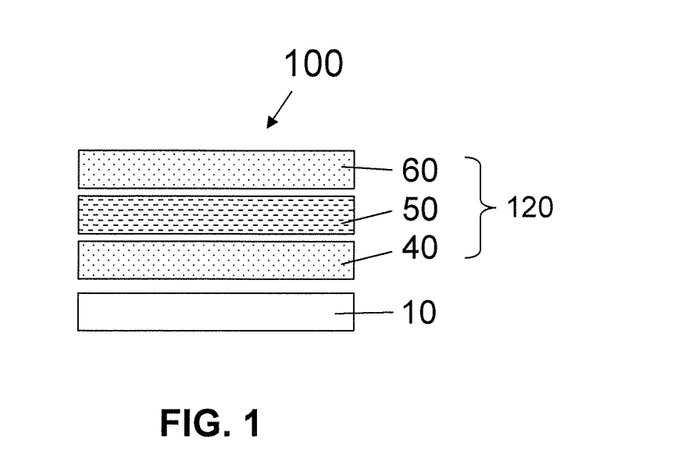
FIG. 1 is an exploded, cross-sectional view of a coated transparency including an electrically conductive multilayer stack according to an embodiment of the present invention.

Embodiments of the present invention are directed to a coated transparency including a transparency and an electrically conductive multilayer stack. In certain embodiments, the electrically conductive multilayer stack includes a first metal oxide layer including aluminum doped zinc oxide (AZO), a metal layer including gold (Au), and a second metal oxide layer including AZO, wherein the first metal oxide layer is positioned over the transparency, the metal layer is positioned over the first metal oxide layer, and the second metal oxide layer is positioned over the metal layer. A coated transparency 100 according to one embodiment of the invention is shown in FIG. 1. As can be seen in the embodiment of FIG. 1, the coated transparency includes a transparency or substrate 10, such as an aircraft canopy, and an electrically conductive multilayer stack 120 including a first metal oxide layer 40 adjacent to a metal layer 50, and a second metal oxide layer 60 adjacent to the metal layer 50, each positioned on or over an adjacent layer in the order shown. The coated transparency may also include additional layers (not shown in FIG. 1), such as tie, base, and top layers, as necessary.

The coated transparency 100 provides the functionality required of a modern stealth aircraft canopy. For example, in certain embodiments, the electrically conductive multilayer stack 120 has a low sheet resistance. More specifically, one or more of the first and second metal oxide layers and the metal layer may be electrically conductive and have a low sheet resistance. When positioned over a transparency or substrate, such as an aircraft canopy, an electrically conductive multilayer stack having a low sheet resistance can prevent or reduce the buildup of static charge on the coated transparency by draining or dissipating the static charge, and it can provide radar attenuation functions to the coated transparency.

Additionally, certain embodiments of the electrically conductive multilayer stack are transparent and, for example, have a visible light transmittance of at least about 65% (e.g., a visible light transmittance in a range of about 65% to about 75%). More specifically, one or more of the first and second metal oxide layers of the electrically conductive multilayer stack may be transparent and/or anti-reflective. Consequently, a coated transparency or substrate, such as an aircraft canopy, including the electrically conductive multilayer stack may be transparent and, for example, have a visible light transmittance of at least about 65%. Indeed, the present inventors have discovered that the metal oxide layers of the electrically conductive multilayer stack can be made thicker than the metal oxide layers of certain previous coatings, and as a result an electrically conductive multilayer stack according to embodiments of the present invention has greater anti-reflective properties and exhibits better visible light transmittance than previous coatings.

In certain embodiments, the electrically conductive multilayer stack includes first and second metal oxide layers including AZO, which is more flexible than certain other transparent conductive metal oxides, such as indium tin oxide (ITO). Specifically, the AZO of exemplary embodiments of the present invention has a strain elongation of about 8%, compared to ITO, which typically has a strain elongation of about 2%. Because AZO is more flexible than, for example, ITO, the first and second metal oxide layers can be made thicker than the metal oxide layers of certain previous coatings. That is, the AZO of embodiments of the present invention can be made thicker and still pass the four point bend test (the four point bend test is described in more detail below), while ITO typically has to be made ultra-thin to pass the four point bend test.

Increasing the thicknesses of the first and second metal oxide layers increases the amount of destructive interference in the visible light reflected by the first and second metal oxide layers and the metal layer, thereby reducing the amount of visible light that is reflected (and consequently increasing the amount of visible light that is transmitted) by an electrically conductive multilayer stack according to an embodiment of the present invention. Although the anti-reflective properties and visible light transmittance of anti-reflective coatings, such as ITO, AZO, and $TiO_2$, depend on the relative refractive index of the coating, those properties also depend on the thickness of the coating. Anti-reflective coatings that have a thickness equal to one quarter of the wavelength of visible light (e.g., light having a wavelength of about 400 nm to about 750 nm, or about 550 nm) produce destructive interference in the reflected visible light, thereby canceling the reflected visible light and increasing the amount of transmitted visible light. That is, when the thickness of the anti-reflective coating is equal to one quarter of the wavelength of the visible light, the visible light reflected by the anti-reflective coating (i.e., the metal oxide layer) will be out of phase with the visible light reflected by the metal layer, and the visible light reflected from the anti-reflective coating and the metal layer will be canceled as a result of destructive interference. Consequently, the light that would have been reflected by the anti-reflective coating (i.e., the metal oxide layer) and the metal layer is instead transmitted through the anti-reflective coating and the metal layer. Because ITO has to be made ultra-thin to pass the below-described four point bend test, the thicknesses of previous ITO layers were substantially less than one quarter of the wavelength of visible light, thereby limiting the amount of destructive interference produced by those ITO layers and reducing the amount of visible light transmitted. By making the first and second metal oxide layers thicker than previous ITO metal oxide layers, the first and second metal oxide layers of embodiments of the present invention may have thicknesses approaching one quarter of the wavelength of visible light, and the anti-reflective properties and visible light transmittance of the electrically conductive multilayer stack according to embodiments of the present invention can be increased as a result of the increased destructive interference in the reflected visible light.

For instance, in certain embodiments, the first metal oxide layer has a thickness in a range of about 5 to about 200 nm, such as about 10 to about 200 nm, about 20 to about 200 nm, or about 30 to about 200 nm. In certain embodiments, the first metal oxide layer has a thickness greater than 20 nm, such as a thickness in a range of greater than 20 to about 200 nm. Additionally, in certain embodiments, the second metal oxide layer has a thickness in a range of about 5 to about 200 nm, such as about 10 to about 200 nm, about 20 to about 200 nm, or about 30 to about 200 nm. For example, in certain embodiments, the second metal oxide layer has a thickness greater than 20 nm, such as a thickness in a range of greater than 20 to about 200 nm. Because AZO has a reduced metal content (e.g., about 2-3 wt % aluminum) as compared to ITO (e.g., about 10 wt % indium), AZO metal oxide layers have better light transmittance and greater flexibility than, for example, comparable ITO metal oxide layers. Consequently, an ITO metal oxide layer cannot be made as thick as an AZO metal oxide layer, according to embodiments of the present invention, and still pass the below-described four point bend test. Specifically, an ITO metal oxide layer having a thickness of greater than 20 nm lacks the flexibility necessary to pass the below-described four point bend test, while AZO metal oxide layers having a thickness greater than 20 nm, or greater than 30 nm, can still pass the below-described four point bend test.

According to embodiments of the present invention, the AZO metal oxide layers may be formed of about 97 to about 99 at. % ZnO and about 1 to about 3 at. % $Al_2O_3$. Because AZO metal oxide layers of embodiments of the present invention are more flexible than, for example, comparable ITO metal oxide layers, the electrically conductive stack of embodiments of the present invention is more flexible, and hence more durable (i.e., has superior mechanical properties), than certain previous multilayer stacks.

The present inventors have also discovered that an electrically conductive multilayer stack according to certain embodiments of the present invention, e.g., an electrically conductive multilayer stack including a metal layer including gold, exhibits better corrosion resistance and durability than certain previous coatings. Because gold is less susceptible to corrosion than certain other metals, such as silver, an electrically conductive multilayer stack including a gold layer is less susceptible to corrosion than certain previous coatings. Consequently, an electrically conductive multilayer stack including a gold metal layer is less likely to suffer from degradation of its electrical (e.g., sheet resistance) and optical properties (e.g., visible light transmittance), resulting in improved durability of a coated transparency including such a multilayer stack.

In certain exemplary embodiments, the electrically conductive multilayer stack includes a first metal oxide layer 40 including AZO, a metal layer 50 including gold, and a second metal layer 60 including AZO, wherein the first metal oxide layer 40 is positioned over a transparency 10, the metal layer 50 is positioned over the first metal oxide layer 40, and the second metal oxide layer 60 is positioned over the metal layer 50. For instance, the electrically conductive multilayer stack may include a metal layer having a thickness in a range of about 5 to about 20 nm. Additionally, in certain embodiments, the electrically conductive multilayer stack includes a metal layer consisting essentially of gold. As used herein, the term "consisting essentially of gold" means that the metal layer primarily contains gold, but may contain other substances that do not affect the sheet resistance and/or radar attenuation properties of the gold. For instance, a metal layer consisting essentially of gold, would be substantially free, or even completely free, of silver (Ag). As used herein, the term "substantially free" means that the material being discussed is present in the composition, if at all, as an incidental impurity. As used herein, the term "completely free" means that the material is not present in the composition at all.

Because gold is less susceptible to corrosion than, for example, silver, a coated transparency including an electrically conductive multilayer stack including a metal layer including gold does not require additional protective organic layers, such as a barrier layer, to protect the metal layer from oxidation. For example, a coated transparency according to certain embodiments of the present invention includes an electrically conductive multilayer stack including a first metal oxide layer including AZO (e.g., first metal oxide layer 40), a metal layer including gold (e.g., metal layer 50), and a second metal oxide layer including AZO (e.g., second metal oxide layer 60), with the proviso that the coated transparency does not include a barrier layer. As a result, such an electrically conductive multilayer stack can be less complicated and less costly to produce than certain previous coatings, because it does not require additional protective organic layers, such as a barrier layer, to protect the metal layer from oxidation. By eliminating the barrier layer, the coated transparency of certain embodiments of the present invention can be produced in fewer steps and with fewer materials than certain previous coatings, thereby reducing the cost and increasing the efficiency of producing the coated transparency.

Nonetheless, certain embodiments of the coated transparency of the present invention may include one or more additional layer(s), such as those set forth below. For example, in certain embodiments, the coated transparency further includes a topcoat (e.g., a conductive top layer including a conductive metal oxide, a quaternary ammonium salt, an inherently conductive polymer, and/or other suitable conductive agent), a base layer(s) (e.g., a layer including a material selected from the group consisting of polyepoxides, polyacrylates, polyurethanes, polysiloxanes, and combinations thereof), and/or a tie layer(s) (e.g., an acrylic polymer and/or mixture of polymers), such as those described in U.S. Patent Application Publication No. 2010/0025533 and U.S. Patent Application Publication No. 2010/0028684, the entire contents of which are herein incorporated by reference.

Figure 2:
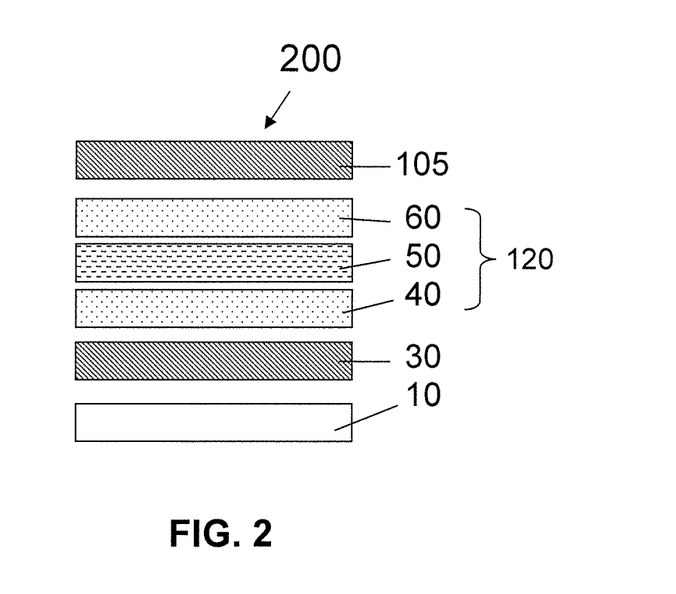
FIGS. 2-4 are exploded, cross-sectional views of coated transparencies according various embodiments of the present invention.

For example, another embodiment of the present invention is shown in FIG. 2. According to this embodiment, a coated transparency 200 includes a substrate 10 (i.e., a transparency), a polymeric base layer 30, an electrically conductive multilayer stack 120, and a topcoat or top layer 105, each positioned on or over an adjacent feature in the order shown. Although not shown, the coated transparency may also include an adhesion promoter, such as 3-aminopropyltriethoxysilane, between the substrate and the subsequent layers. The substrate and electrically conductive multilayer stack are similar to those described above with reference to FIG. 1.

In this particular embodiment, the topcoat or top layer 105 is in direct physical contact with the second metal oxide layer 60. The topcoat or top layer 105 is the outer most layer of the multilayer stack 200, and is made of a tough, durable and weather resistant material, yet is sufficiently pliable and flexible to prevent crack formation due to thermal stress. It is conductive and helps dissipate static charge and other electromagnetic forces. The topcoat has antistatic properties and allows static charge to be dissipated to the underlying conductive layer(s). For example, the coated transparency may include a topcoat (e.g., a conductive top layer including a conductive metal oxide, a quaternary ammonium salt, an inherently conductive polymer, and/or other suitable conductive agent) as described in U.S. Patent Application Publication No. 2010/0025533 and U.S. Patent Application Publication No. 2010/0028684. In certain embodiments, the topcoat includes polyurethane.

In the case of a modern aircraft canopy, the substrate is typically an organic resin such as polycarbonate or polyacrylate. Hence, the base layer is selected to adhere well to such a material. The base layer covers the imperfections of the substrate and promotes adhesion of the first metal oxide layer to the substrate. That is, the base layer 30 couples the canopy (i.e., the transparency) to the electrically conductive multilayer stack 120, and should be capable of bonding thereto. The base layer should be hard enough to support the ceramic metal oxide antireflective coating, and the base layer should not adversely affect the impact resistance of the substrate. Additionally, a soft tie coat may be positioned between the base layer and the substrate. The tie coat dissipates the shrinkage stress that results from the addition of the other layers (e.g., the base layer and the electrically conductive multilayer stack 120), and the tie coat accommodates the dimensional change of the substrate due to extreme thermal exposure.

In one embodiment of the invention, the base layer 30 comprises a material selected from the group consisting of polyepoxides, polyacrylates, polyurethanes, polysiloxanes, and combinations thereof. A polysiloxane base layer may be particularly useful as a result of its inorganic composition and hardness. As such, the base layer 30 may include a polymeric and/or oligomeric silane, among other species. For example, a coating composition may be prepared from a combination of monomeric silanes and silane terminated polymers that are hydrolyzed in a mixture of water and acid to form silanols, which are condensed to a precondensate state after being formed. When the coating composition is applied to a surface and cured, the precondensate, which includes the silanols, reacts to form siloxane linkages, thereby forming an exemplary polysiloxane base layer 30. Alternatively, the base layer 30 may include any suitable polyepoxide, polyacrylate, or polyurethane. For example, the base layer 30 may include a thermally-curable polyacrylate coated with the above-described polysiloxane.

Figure 3:
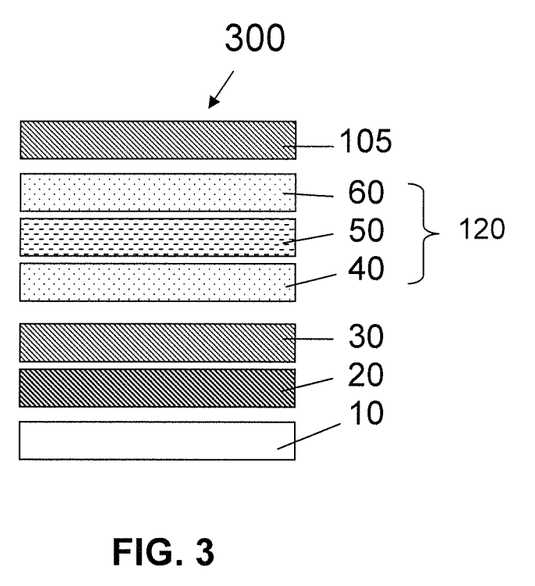

Another embodiment of the present invention is shown in FIG. 3. According to this embodiment the coated transparency 300 includes a transparency 10 (i.e., a substrate), a base layer 30, an electrically conductive multilayer stack 120, and a topcoat 105, as described above. The coated transparency further includes a tie layer 20 between the transparency 10 and the base layer 30.

In the case where the substrate is a polyacrylate, polycarbonate, or similar organic resin, the tie layer 20 can be an acrylic polymer or mixture of polymers, for example an acrylic polymer made of one or more alkyl acrylates and/or methacrylates. Optionally, the tie layer may also include one or more additional adhesion promoters, such as additional monomers. The layer can be applied to the substrate by gravity coating or another suitable application technique. In gravity coating, a polymeric solution of the tie layer polymer(s) or precursor monomers is prepared, and the solution is applied to the canopy in the center and along a longitudinal axis that extends along the entire length of the canopy. The polymeric solution is then discharged from a nozzle and poured over the canopy at the top, allowing the solution to flow down both sides and thereby coat the surface of the canopy. The solution is applied slowly from one end to another along the longitudinal axis of the canopy, until the entire canopy is coated with a tie layer. The coating thickness can be controlled by, for example, the viscosity of the polymeric solution. The liquid coating can be applied by multiple passes to ensure a consistent layer is formed across the canopy. Any excess drips off the canopy are collected at the bottom, through a gutter, where it can be properly disposed of and/or re-used.

In another embodiment, multiple streams of the polymeric solution are directed to impinge on the canopy. The solution streams are ejected through one or more nozzles or other outlets at a constant flow rate. By keeping the flow rate of the polymeric solution constant, the thickness of the coating can be controlled. In addition to the flow rate, the thickness of the coating also depends on the viscosity of the polymeric solution. Increasing the viscosity of the polymeric solution increases the thickness of the coating. In certain embodiments, the viscosity of the polymeric solution is in a range of between about 2 to about 200 centipoise. Once the canopy is coated with the tie layer material(s), it is air dried, under atmospheric conditions and ambient temperatures, and then cured using heat or ultraviolet light.

After the tie layer 20 is applied to the substrate 10 and cured, the base layer 30 is applied by gravity coating or a process similar to that described above. The substrate, including the tie layer 20 and the base layer 30, is then allowed to air dry under ambient conditions, and then cured.

The first metal oxide layer 40 is applied to the base layer 30 using a suitable deposition technique, such as physical vapor deposition or a sputtering process. In one exemplary embodiment, it is formed using a magnetron sputtering process in which a high voltage plasma discharge causes atoms to be ejected from a target, such as an indium tin alloy or indium tin oxide ceramic. The metal atoms then strike the base layer and form a thin, transparent layer of metal oxide. Since the coating is formed on an atomic scale, it is possible to produce uniform layers of films. For AZO, the metal oxide layer 40 can be applied at a relatively moderate temperature, i.e. from about 100° F. to about 200° F. The substrate, including the tie layer 20 and the base layer 30, is heated to a temperature within that range, and a sufficiently thick layer is deposited thereon.

In an exemplary embodiment, the AZO film is formed using pulsed DC magnetron sputtering in an argon and $O_2$ gas mixture at a temperature of about 100 to about 200° F. According to this exemplary embodiment, an AZO ceramic target including about 97 to about 99 wt % ZnO and about 1 to about 3 wt % $Al_2O_3$ is used.

Once the first metal oxide layer 40 is applied, the metal layer 50 is applied using a physical vapor deposition or sputtering process as described above. For gold, the deposition process can be carried out at temperature of about 100° F. to about 200° F. After the metal layer 50 is deposited, the second metal oxide layer 60 is then applied, using a process similar to that described above.

After the electrically conductive multilayer stack 120 is formed, a topcoat may be formed thereon. For example, as shown in FIGS. 2 and 3, the topcoat 105 may be formed directly on the second metal oxide layer 60 to provide a topcoat 105 that is in direct physical contact with the second metal oxide layer 60.

Figure 4:
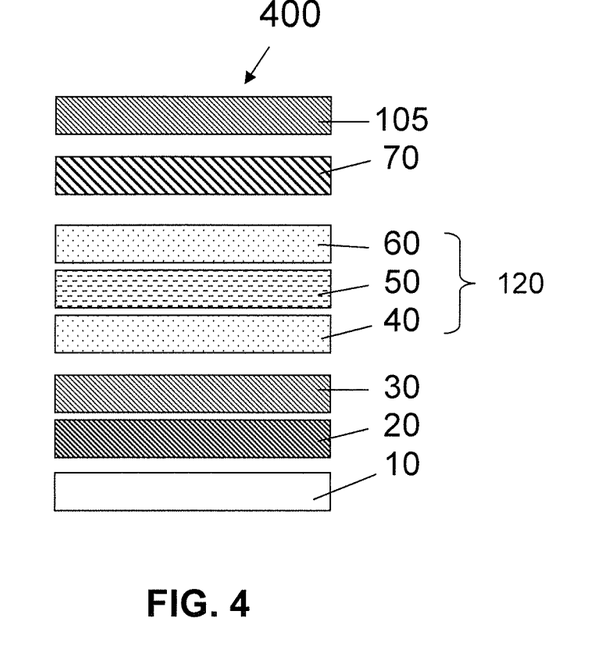

Alternatively, the coated transparency may include a tie layer (e.g., a conductive tie layer) between the electrically conductive stack and the topcoat, as shown in FIG. 4. According to the embodiment shown in FIG. 4, the coated transparency includes a substrate 10 (i.e., a transparency), a tie layer 20, a base layer 30, an electrically conductive multilayer stack 120, and a topcoat 105, as described above. The coated transparency further includes a topcoat tie layer 70 between the topcoat 105 and the electrically conductive multilayer stack 120. In one embodiment, the topcoat tie layer 70 includes a polymeric resin that is compatible with the topcoat 105 and optionally includes an organosiloxane compound, which can interact with and bond to the second metal oxide layer 60 of the electrically conductive multilayer stack 120. The topcoat 105 may be made of a durable, weather resistant polymer, such as polyurethane. For example, the tie layer and topcoat may include a tie layer (e.g., an acrylic polymer and/or mixture of polymers) or topcoat (e.g., a conductive top layer including a conductive metal oxide, a quaternary ammonium salt, an inherently conductive polymer, and/or other suitable conductive agent), respectively, such as those described in U.S. Patent Application Publication No. 2010/0025533 and U.S. Patent Application Publication No. 2010/0028684.

The following examples are presented for illustrative purposes only and are not to be viewed as limiting the scope of the present invention. Unless otherwise indicated, all parts and percentages in the following examples, as well as throughout the specification, are by weight.

EXAMPLE 1

A polycarbonate coupon was prepared and then lightly abraded to increase its surface roughness and surface area for receiving a primer (3-aminopropyltriethoxy silane, an adhesion promoter). The primer was gravity coated onto the coupon. Next, a polymeric solution (FX-430, produced by PPG Industries, Inc.,) was applied to the coupon by flow coating. The polymeric solution was poured from the top of the coupon and from one end to another, allowing the solution to flow down and coat the coupon by gravity flow. Excess polymeric solution was allowed to flow down into a dripping pan and was collected for proper disposal.

After the entire outer surface of the coupon has been coated, it was cured in a heated oven at about 230° F. for about 5 hours. After the coating was cured, the coupon was abraded to increase its surface area for receiving the next coating layer and then cleaned with Isopropanol (IPA). A silane basecoat was then applied by flow coating, followed by a layer of a base coat (FX-419, produced by PPG Industries, Inc.). The coated coupon was then cured in a preheated oven at a temperature of about 190° F. for about 2 hours. After curing, the coupon was thoroughly cleaned to remove dust particles and particulates that may have accumulated on the surface.

The cleaned coupon was then placed in a vacuum chamber. The pressure in the vacuum chamber was reduced and the substrate in the chamber was heated to about 100 to about 200° F. Two metal oxide layers and one metal layer were deposited on the coated coupon at an elevated temperature (e.g., about 100 to about 200° F.) using magnetron sputtering. First, a layer of AZO was formed, and then a gold layer was deposited onto the coupon at the same temperature. After a layer of gold was formed, a second layer of AZO was deposited on top of the gold layer at a temperature of about 100 to about 200° F. The coupon was then removed from the chamber and then cleaned to remove any contaminants that might have adhered to the surface.

A topcoat (FX-446, produced by PPG Industries, Inc.) was then applied to the second metal oxide layer (i.e., second AZO layer) and cured. The following test procedures were then performed on the coated transparency of Example 1.

Haze and Luminous Transmittance Tests

A 3 inch by 12 inch coupon prepared according to Example 1 was tested according to ASTM D1003 using a Haze-Gard Plus instrument. Haze measures the clearness and transparency of the film (the film should not be translucent and diffuse light), while the luminous or visible light transmittance indicates the amount of visible light transmitted through the sample. The coupon exhibited a visible light transmittance of 65-75% and a haze of 0.25-1%. According to the test results, the coupon meets the visible light transmittance and haze values required for aircraft canopy, windshield and windows, which are 65% or above and 10% or below, respectively.

Cross-Hatch Adhesion

A 3 inch by 12 inch coupon prepared according to Example was tested for cross-hatch adhesion according to ASTM D3359. The coating exhibited 100% adhesion to the substrate.

Humidity Test

A 3 inch by 12 inch coupon prepared according to Example 1 was exposed to 100% condensing humidity at 122° F. (50° C.) for 336 hours (2 weeks), and then subjected to the cross-hatch adhesive test according to ASTM D3359. Prior to the humidity test, the coupon exhibited a visible light transmittance of 71-73% and haze of 0.5-2%, as determined by the above-described haze and luminous transmittance test. After the humidity test, the coupon exhibited a visible light transmittance of 69-72% and haze of 1-2.5%, as determined by the above-described haze and luminous transmittance test. The cross-hatch adhesive test revealed 100% adhesion of the coating to the substrate. According to the test results, the coupon exposed to the humidity test did not degrade or lose adhesion, and the humidity test did not significantly alter the visible light transmittance or haze of the coupon.

Humidity and Solar Radiation (QUV) Test

A 3 inch by 12 inch coupon prepared according to Example 1 was exposed to ultraviolet (UV) radiation for 8 hours at 158° F. (70° C.). The coupon was then exposed to condensation for 4 hours at 122° F. (50° C.). The cycles were repeated for a total of 336 hours (2 weeks). The coupon was then subjected to the cross-hatch adhesive test according to ASTM D3359. Prior to the QUV test, the coupon exhibited a visible light transmittance of 71-73% and haze of 0.5-2%, as determined by the above-described haze and luminous transmittance test. After the QUV test, the coupon exhibited a visible light transmittance of 70-72% and haze of 1-2.5%, as determined by the above-described haze and luminous transmittance test. The cross-hatch adhesive test revealed 100% adhesion of the coating to the substrate. According to the test results, the coupon exposed to the QUV test did not degrade or lose adhesion, and the QUV test did not significantly alter the visible light transmittance or haze of the coupon.

Steam Test

A 2 inch by 2 inch coupon prepared according to Example 1 was placed just above boiling water for 6 hours in an enclosed chamber. The coupon was then subjected to the cross-hatch adhesive test according to ASTM D3359. Prior to the steam test, the coupon exhibited a visible light transmittance of 69-73% and haze of 0.5-1%, as determined by the above-described haze and luminous transmittance test. After the steam test, the coupon exhibited a visible light transmittance of 68-72% and haze of 1-2.5%, as determined by the above-described haze and luminous transmittance test. The cross-hatch adhesive test revealed 100% adhesion of the coating to the substrate. According to the test results, the coupon exposed to the steam test for 6 hours did not degrade or lose adhesion, and the accelerated steam test did not significantly alter the visible light transmittance or haze of the coupon.

Bayer Abrasion Test

The abrasion resistance of a 2 inch by 2 inch coupon prepared according to Example 1 was tested according to ASTM F735 for 600 cycles. Prior to the Bayer abrasion test, the coupon exhibited a visible light transmittance of 69-73% and haze of 0.5-1%, as determined by the above-described haze and luminous transmittance test. After the abrasion test, the coupon exhibited a visible light transmittance of 68-72% and haze of 1-2.5%, as determined by the above-described haze and luminous transmittance test. According to the test results, the visible light transmittance and haze of the coupon were not significantly altered by the Bayer abrasion test.

Rain Erosion Test

Several 1 inch by 1 inch coupons prepared according to Example 1 were exposed to simulated rainfall at the University of Dayton Research Institute (UDRI). In one test, a coupon was exposed to 1.0 inches/hour of simulated rainfall at a wind speed of 350 miles per hour (mph). After 11 minutes of exposure to the simulated rainfall, the coupon was visually inspected, and then the rain erosion test was repeated for a total test duration of 88 minutes, with visual inspection performed every 11 minutes. The preceding test was repeated, with visual inspection performed every 11 minutes, using a coupon that had previously been subjected to the QUV test. In yet another test, a coupon was exposed to 1.0 inches/hour of simulated rainfall at a wind speed of 550 mph for a duration of 22 minutes, with visual inspection performed every 11 minutes. In each of the tests, the coupon was inclined at an angle of 30 degrees to the direction of the wind. Excluding the trailing edges, the coupons exposed to the 350 mph and 550 mph simulated rainfall did not degrade beyond the allowable tolerance of having 90% of the coating remain after exposure to the simulated rainfall. That is, after the rain erosion test, less than 10% of the coating had been removed from the coupons, excluding the trailing edges of the coupons.

Salt Spray (Salt Fog/$SO_2$) Test

Two 2 inch by 12 inch coupons prepared according to Example 1 were tested in accordance with ASTM G85 annex A4. The coupons were inclined at an angle of 30 degrees from vertical and exposed to a salt/sulfur dioxide ($SO_2$) fog for 168 hours (1 week). The salt fog/$SO_2$ tests were performed at NTS in Santa Clarita. Prior to the salt fog/$SO_2$ test, the coupons exhibited a visible light transmittance of 68-72% and haze of 0.25-1%, as determined by the above-described haze and luminous transmittance test. After the salt fog/$SO_2$ test, the coupons exhibited a visible light transmittance of 66-70% and haze of 1-2%, as determined by the above-described haze and luminous transmittance test. Subsequent to the salt fog/$SO_2$ tests, the coupons were subjected to the cross-hatch adhesive test according to ASTM D3359. The cross-hatch adhesive tests revealed 100% adhesion of the coating to the substrate. According to the test results, the coupons exposed to the salt fog/$SO_2$ test for 168 hours did not degrade or lose adhesion, and the salt fog/$SO_2$ test did not significantly alter the visible light transmittance or haze of the coupons.

Precipitation Static (P-Static) Test

To test the ability of the multilayer stack to migrate an electrical charge without degradation, a 3 inch by 12 inch coupon prepared according to Example 1 was subjected to a current density of 0.347 µA/in$^2$ (50 µA/ft$^2$) at −40° F. (−40° C.) for 4 hours. Visual inspection of the coupon after testing showed no visible burns or degradation of the surface of the coating. The multilayer stack of the coating did not discharge during any of the test blocks and no major fluctuations of current occurred during testing.

Sheet Resistance Test

The sheet resistance of a 3 inch by 12 inch coupon prepared according to Example 1 was tested using a four point probes surface resistivity meter from Guardian Manufacturing Inc. The sheet resistance of the Au was determined to be 5-20 ohms per square (Ω/□).

Certain of the above-described test results for the coated transparency of Example 1 are summarized below in Tables 1 and 2.

TABLE 1

| Test | Visible Light Transmittance | Haze | Cross-Hatch Adhesion |
|---|---|---|---|
| No Test (Untreated) (3" × 12" coupon) | 65-75% | 0.25-1% | 100% adhesion |
| Humidity (3" × 12" coupon) | Before: 71-73% After: 69-72% | Before: 0.5-2% After: 1-2.5% | Before: 100% adhesion After: 100% adhesion |
| QUV (3" × 12" coupon) | Before: 71-73% After: 70-72% | Before: 0.5-2% After: 1-2.5% | Before: 100% adhesion After: 100% adhesion |
| Accelerated Steam (2" × 2" coupon) | Before: 69-73% After: 68-72% | Before: 0.5-1% After: 1-2.5% | Before: 100% adhesion After: 100% adhesion |
| Bayer Abrasion (2" × 2" coupon) | Before: 69-73% After: 68-72% | Before: 0.5-% After: 1-2.5% | Before: 100% adhesion After: N/A |
| Salt Fog/$SO_2$ (2" × 12" coupon) | Before: 68-72% After: 66-70% | Before: 0.25-1% After: 1-2% | Before: N/A After: 100% adhesion |

TABLE 2

| Test | Result |
|---|---|
| Humidity | Two weeks of exposure did not significantly alter the condition, adhesion, visible light transmittance or haze of the coupon |
| QUV | Two weeks of exposure did not significantly alter the condition, adhesion, visible light transmittance or haze of the coupon |
| Bayer Abrasion | The abrasion test did not significantly alter the visible light transmission or haze of the coupon |
| Rain Erosion | 350 mph for 88 min: 100% 350 mph for 88 min (QUV exposed coupon): 100% 550 mph for 22 min: 100% |
| Salt fog/$SO_2$ | One week of exposure did not significantly alter the condition, adhesion, visible light transmittance or haze of the coupon |
| P-Static | Passed 50 µA/ft$^2$ at −40° C. (no discharge or major fluctuations of current during test; no visible burns or degradation observed after test) |
| Humidity | 2 weeks - No Damage |
| QUV | 2 weeks - No Damage |
| Rain Erosion | 350 mph for 88 min: 100% 350 mph for 88 min (QUV exposed coupon): 100% 550 mph for 22 min: 100% |
| Sheet Resistance of Au | 5-20 Ω/□ |

COMPARATIVE EXAMPLE 1

ITO/Au/ITO

A first ITO layer was prepared using a pulsed DC magnetron sputtering system in an Ar and $O_2$ gas mixture at a temperature of about 100 to about 200° F. An ITO ceramic target including about 90 at. % $In_2O_3$ and 10 at. % $Sn_2O_4$ was used. A gold layer was deposited on the first ITO layer using a DC magnetron sputtering system at a temperature of about 100 to about 200° F. using an Ar gas atmosphere. A second ITO layer was formed over the gold layer using a pulsed DC magnetron sputtering system in an Ar and $O_2$ gas mixture at a temperature of about 100 to about 200° F.

COMPARATIVE EXAMPLE 2

ITO/Ag/ITO

A first ITO layer was prepared using a pulsed DC magnetron sputtering system in an Ar and $O_2$ gas mixture at a temperature of about 100 to about 200° F. An ITO ceramic target including about 90 at. % $In_2O_3$ and 10 at. % $Sn_2O_4$ was used. A silver layer was deposited on the first ITO layer using a DC magnetron sputtering system at room temperature using an Ar gas atmosphere. A second ITO layer was formed over the silver layer using a pulsed DC magnetron sputtering system in an Ar and $O_2$ gas mixture at room temperature.

Coupons prepared according to Comparative Examples 1 and 2 were punctured to expose the metallic layer of the coating, and subjected to the above-described Salt Fog/$SO_2$ test. The coupon including a silver layer (i.e., the coupon according to Comparative Example 2) exhibited a circular bluish defect having a diameter of about one inch, which indicated corrosion of the silver layer. The coupon including a gold layer did not did not exhibit any signs of corrosion. When exposed to the above-described humidity, QUV, and steam tests, coupons according to Comparative Example 2 exhibited occasional signs of corrosion. The humidity, QUV and steam tests had no effect on the coupons prepared according to Comparative Example 1. Coupons according to Comparative Examples 1 and 2 exhibited similar results for the Bayer abrasion test, as the coupons included identical topcoats.

Figure 5:
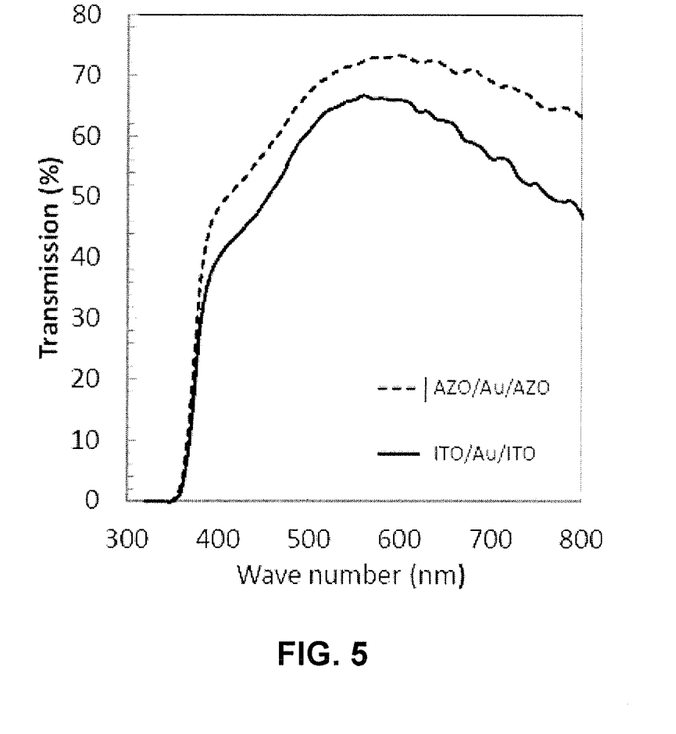
FIG. 5 is a graph showing light transmittance versus wavelength of light for a multilayer stack including AZO/Au/AZO and a multilayer stack including ITO/Ag/ITO.

FIG. 5 is a graph showing light transmittance versus wavelength of light of a multilayer AZO/Au/AZO stack presented in this patent and for the multilayer stack of Comparative Example 1, which includes an ITO/Au/ITO stack. As can be seen in FIG. 5, the multilayer stack including AZO/Au/AZO exhibits enhanced light transmittance in the visible light region (e.g., about 390 to about 750 nm) as compared to the light transmittance of the comparative multilayer stack consisting of ITO/Au/ITO.

Four Point Bend Test

Figure 6:
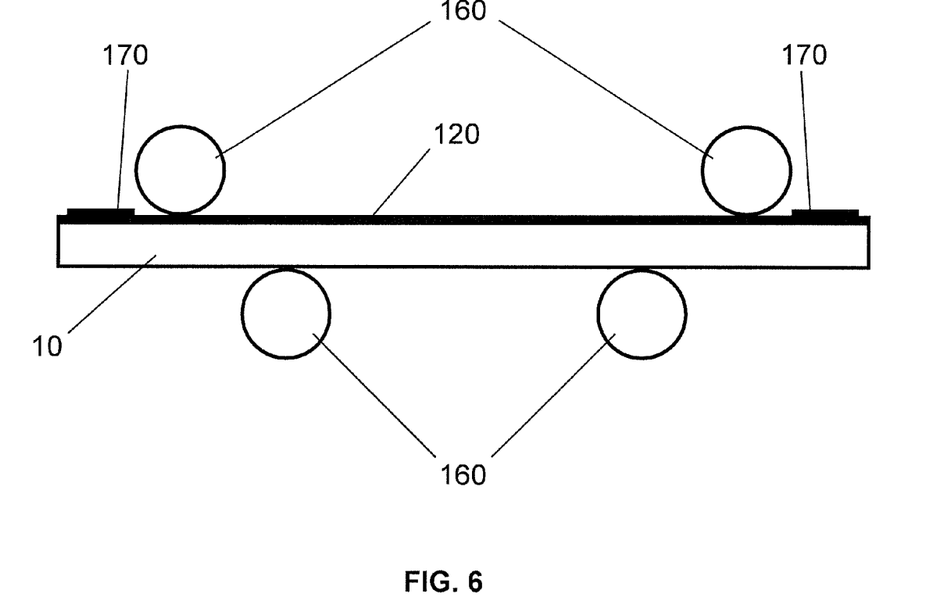
FIG. 6 is a schematic side view of the arrangement used in the Four Point Bend Test.
Figure 7:
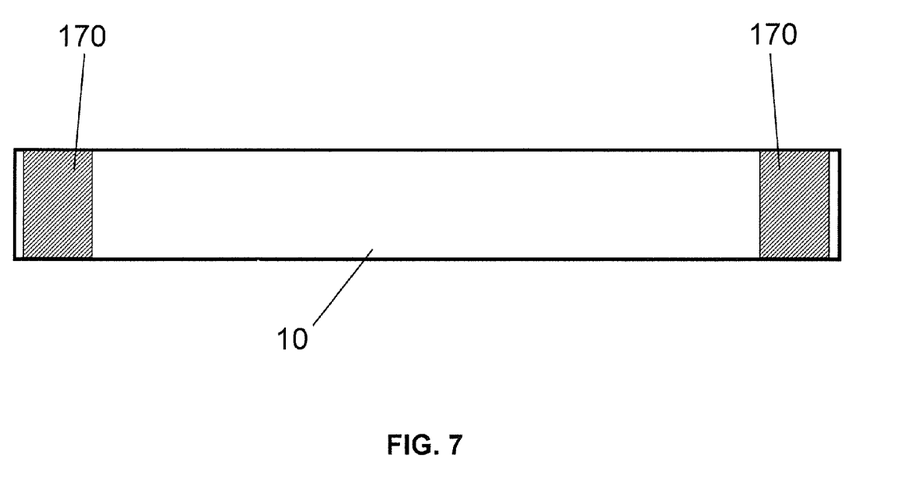
FIG. 7 is a schematic top view of a portion of the arrangement used in the Four Point Bend Test.

Multilayer stacks prepared according to Example 1, Comparative Example 1, and Comparative Example 2 were subjected to the four point bend test to measure the change in electrical resistance ($\Delta R/R$) for each multilayer stack as a function of the uniaxial tensile elongation of the multilayer stack. For example, a coupon according to Example 1 was prepared for the four point bend test as follows. A first basecoat was applied on a substrate 10 (i.e., a transparency) 2 inches wide, 12 inches in length, and 0.75 inches thick. Then, an electrically conductive multilayer stack 120 including AZO/Au/AZO was deposited on the substrate 10 in a vacuum chamber. A conductive tape (one inch wide) was then vertically applied over the electrically conductive multilayer stack to provide application sites for the bus-bars 170, as shown in FIGS. 6 and 7. The remaining portion of the electrically conductive multilayer stack (8.5 inches in length) was coated with a primer and a topcoat. No organic coating was applied over the conductive tape. Two flexible metallic conductive bus-bars 170 were applied over the conductive tape as shown in FIGS. 6 and 7, and the bus-bus resistance of the coupon was recorded.

Next, a strain gage resistor (not shown) obtained from Vishay measurement was mounted on the center section of the substrate, on the side opposite to the bus-bars. The strain gage was used to determine the tensile elongation (flexibility) of the coating layers. A tensile load was applied to the substrate using a united tensile testing system. Four bending bars 160, shown in FIG. 6, applied the tensile load. The bending bars 160 on the side opposite to the bus-bars were spaced about 4 inches apart. The electrical bus-bus resistance was monitored throughout the test. If the resistance of the substrate exceeded 20% above the original value, the tensile strain of the coupon was recorded. The four point bend test was then repeated, as described-above, for coupons prepared according to Comparative Example 1 (i.e., a coupon including an ITO/Au/ITO stack) and Comparative Example 2 (i.e., a coupon including an ITO/Ag/ITO stack).

Figure 8:
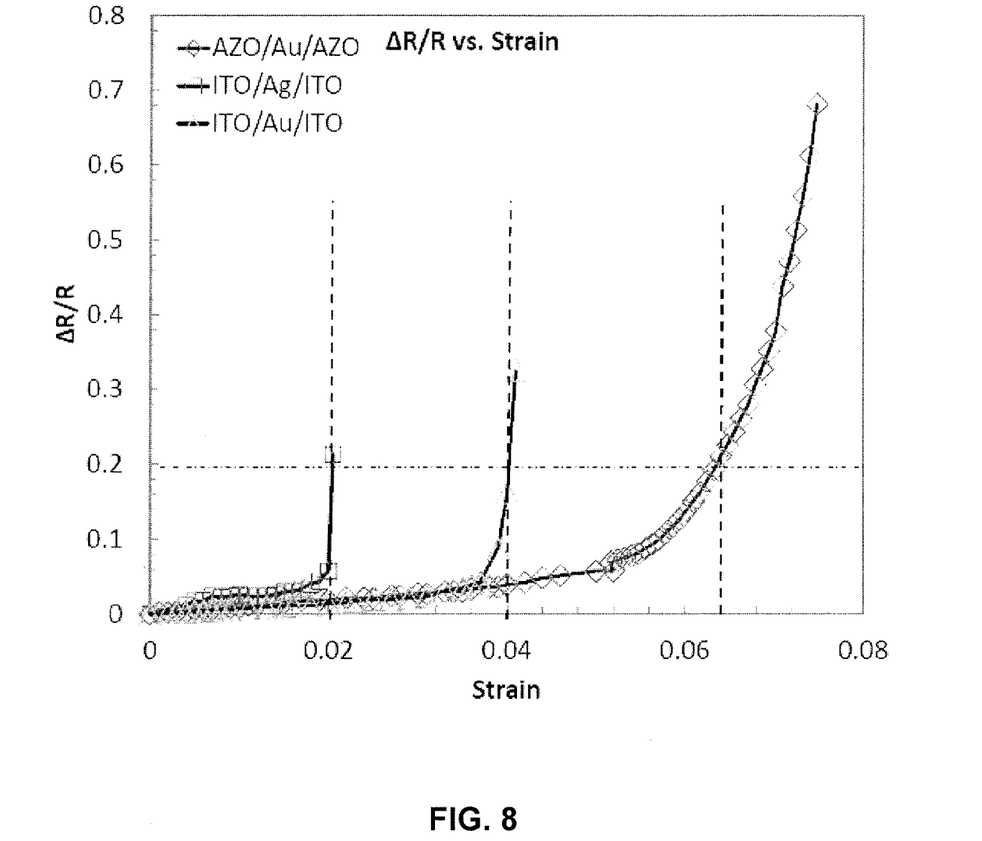
FIG. 8 is a graph showing the results of the Four Point Bend Test for various multilayer stacks.

The results of the above-described four point bend test are shown in FIG. 8, which is a graph of the change in electrical resistance ($\Delta R/R$) versus strain for the multilayer stacks prepared according to Example 1 (labeled as "AZO/Au/AZO"), Comparative Example 1 (labeled as "ITO/Au/ITO") and Comparative Example 2 (labeled as "ITO/Ag/ITO"). A summary of the results of the four point bend test is also shown below in Table 3.

TABLE 3

| Sample | Four Point Bend Test Results: Uniaxial Tensile Elongation (%) |
| --- | --- |
| Example 1 (2" × 12" coupon) | about 6.4% |
| Comparative Example 1 (2" × 12" coupon) | about 4% |
| Comparative Example 2 (2" × 12" coupon) | about 2% |

As can be seen in FIG. 8 and Table 3, Example 1 performed substantially better in the four point bend test than either Comparative 1 or Comparative Example 2. Specifically, according to the above-described four point bend test, Example 1, which includes an AZO/Au/AZO multilayer stack according to an exemplary embodiment of the present invention, exhibited a greater than 50% increase in uniaxial tensile elongation over Comparative Example 1, which includes an ITO/Au/ITO multilayer stack. That is, Example 1 exhibited about 6.4% uniaxial tensile elongation, while Comparative Example 1 exhibited about 4% uniaxial tensile elongation. Additionally, according to the above-described four point bend test, Example 1 exhibited a greater than 200% increase in uniaxial tensile elongation over Comparative Example 2, which includes an ITO/Ag/ITO multilayer stack. That is, Example 1 exhibited about 6.4% uniaxial tensile elongation, while Comparative Example 2 exhibited about 2% uniaxial tensile elongation. Accordingly, an exemplary embodiment of the present invention performed substantially better in the above-described four point bend test than Comparative Examples 1 and 2.

Although various embodiments of the invention have been described, additional modifications and variations will be apparent to those skilled in the art. For example, the coated transparency can have additional tie layers or primers, conductive tie layer, alternate thicknesses, additional components, etc. Also, as the individual layers that comprise the coated transparency are formed, they can be cleaned before the next adjacent layer is deposited. For example, the canopy can be cleaned with a solvent such as acetone, and then dried to remove any surface water, which could cause premature crosslinking of the polysiloxane of the base layer 30. The invention is not limited to the embodiments specifically disclosed, and the coated transparency, its layers, and compositions may be modified without departing from the invention, which is limited only by the appended claims and equivalents thereof.

What is claimed is:

1. A coated transparency comprising:
a transparency; and
an electrically conductive multilayer stack comprising:
a first metal oxide layer comprising aluminum doped zinc oxide (AZO);
a metal layer consisting of gold, the metal layer being substantially free of silver; and
a second metal oxide layer comprising AZO,
wherein the first metal oxide layer is positioned over the transparency, the metal layer is positioned over the first metal oxide layer, and the second metal oxide layer is positioned over the metal layer, and
wherein the transparency is an aircraft canopy.

2. The coated transparency of claim 1, wherein the first metal oxide layer has a thickness in a range of about 10 to about 200 nm.

3. The coated transparency of claim 2, wherein the first metal oxide layer has a thickness in a range of greater than 20 to about 200 nm.

4. The coated transparency of claim 1, wherein the metal layer has a thickness in a range of about 5 to about 20 nm.

5. The coated transparency of claim 1, wherein the second metal oxide layer has a thickness in a range of about 10 to about 200 nm.

6. The coated transparency of claim 5, wherein the second metal oxide layer has a thickness in a range of greater than 20 to about 200 nm.

7. The coated transparency of claim 1, wherein the electrically conductive multilayer stack is transparent.

8. The coated transparency of claim 1, wherein the electrically conductive multilayer stack has a visible light transmittance of at least about 65%.

9. The coated transparency of claim 1, further comprising a base layer positioned over the transparency, wherein the base layer is between the transparency and the electrically conductive multilayer stack.

10. The coated transparency of claim 9, wherein the base layer comprises a material selected from the group consisting of polyepoxides, polyacrylates, polyurethanes, polysiloxanes, and combinations thereof.

11. The coated transparency of claim 9, further comprising a tie layer positioned over the transparency, wherein the tie layer is between the transparency and the base layer.

12. The coated transparency of claim 1, further comprising a topcoat positioned over the electrically conductive multilayer stack.

13. The coated transparency of claim 12, wherein the topcoat comprises polyurethane.

14. The coated transparency of claim 12, wherein the topcoat is in direct physical contact with the second metal oxide layer.

15. The coated transparency of claim 12 further comprising a topcoat tie layer between the topcoat and the electrically conductive multilayer stack.

16. The coated transparency of claim 15, wherein the topcoat tie layer is electrically conductive.

17. A coated transparency comprising:
a transparency comprising an aircraft canopy;
an electrically conductive multilayer stack comprising:
a first metal oxide layer comprising aluminum doped zinc oxide (AZO);
a metal layer, the metal layer being substantially free of silver; and
a second metal oxide layer comprising AZO,
wherein the first metal oxide layer is positioned over the transparency, the metal layer is positioned over the first metal oxide layer, and the second metal oxide layer is positioned over the metal layer; and
a conductive layer in direct physical contact with the second metal oxide layer.

18. An aircraft canopy comprising:
a transparency; and
an electrically conductive multilayer stack comprising:
a first metal oxide layer comprising aluminum doped zinc oxide (AZO);
a metal layer, the metal layer being substantially free of silver; and
a second metal oxide layer comprising AZO,
wherein the first metal oxide layer is positioned over the transparency, the metal layer is positioned over the first metal oxide layer, and the second metal oxide layer is positioned over the metal layer.

* * * * *